United States Patent
Pillarisetty et al.

(10) Patent No.: US 9,634,007 B2
(45) Date of Patent: Apr. 25, 2017

(54) TRENCH CONFINED EPITAXIALLY GROWN DEVICE LAYER(S)

(71) Applicants: Ravi Pillarisetty, Portland, OR (US); Seung Hoon Sung, Beaverton, OR (US); Niti Goel, Austin, TX (US); Jack T. Kavalieros, Portland, OR (US); Sansaptak Dasgupta, Santa Clara, CA (US); Van H. Le, Beaverton, OR (US); Willy Rachmady, Beaverton, OR (US); Marko Radosavljevic, Beaverton, OR (US); Gilbert Dewey, Hillsboro, OR (US); Han Wui Then, Portland, OR (US); Niloy Mukherjee, Beaverton, OR (US); Matthew V. Metz, Portland, OR (US); Robert S. Chau, Beaverton, OR (US)

(72) Inventors: Ravi Pillarisetty, Portland, OR (US); Seung Hoon Sung, Beaverton, OR (US);

(Continued)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 14/302,350

(22) Filed: Jun. 11, 2014

(65) Prior Publication Data

US 2014/0291726 A1    Oct. 2, 2014

Related U.S. Application Data

(62) Division of application No. 13/630,527, filed on Sep. 28, 2012, now Pat. No. 8,765,563.

(51) Int. Cl.
*H01L 29/66* (2006.01)
*H01L 29/78* (2006.01)
(Continued)

(52) U.S. Cl.
CPC ............ *H01L 27/092* (2013.01); *B82Y 10/00* (2013.01); *B82Y 40/00* (2013.01);
(Continued)

(58) Field of Classification Search
CPC ........... H01L 21/76254; H01L 21/0254; H01L 21/0262; H01L 33/0079; H01L 21/02639
(Continued)

(56) References Cited

U.S. PATENT DOCUMENTS 6,815,738 B2    11/2004   Rim
6,921,700 B2     7/2005   Orlowski et al.
(Continued)

FOREIGN PATENT DOCUMENTS

KR    10-2006-0028575 A    3/2006
KR       10-0855857 B1     9/2008
(Continued)

OTHER PUBLICATIONS

International Search Report and Written Opinion mailed Sep. 27, 2013 for PCT/US2013/046901 filed Jun. 20, 2013.
(Continued)

*Primary Examiner* — Long K Tran
*Assistant Examiner* — Thai T Vuong
(74) *Attorney, Agent, or Firm* — Blakely, Sokoloff, Taylor & Safman LLP

(57) ABSTRACT

Trench-confined selective epitaxial growth process in which epitaxial growth of a semiconductor device layer proceeds within the confines of a trench. In embodiments, a trench is fabricated to include a pristine, planar semiconductor seeding surface disposed at the bottom of the trench. Semiconductor regions around the seeding surface may be recessed relative to the seeding surface with Isolation dielectric disposed there on to surround the semiconductor seeding layer and form the trench. In embodiments to form the (Continued)

trench, a sacrificial hardmask fin may be covered in dielectric which is then planarized to expose the hardmask fin, which is then removed to expose the seeding surface. A semiconductor device layer is formed from the seeding surface through selective heteroepitaxy. In embodiments, non-planar devices are formed from the semiconductor device layer by recessing a top surface of the isolation dielectric. In embodiments, non-planar devices CMOS devices having high carrier mobility may be made from the semiconductor device layer.

5 Claims, 8 Drawing Sheets

(72) Inventors: Niti Goel, Austin, TX (US); Jack T. Kavalieros, Portland, OR (US); Sansaptak Dasgupta, Santa Clara, CA (US); Van H. Le, Beaverton, OR (US); Willy Rachmady, Beaverton, OR (US); Marko Radosavljevic, Beaverton, OR (US); Gilbert Dewey, Hillsboro, OR (US); Han Wui Then, Portland, OR (US); Niloy Mukherjee, Beaverton, OR (US); Matthew V. Metz, Portland, OR (US); Robert S. Chau, Beaverton, OR (US)

(51) Int. Cl.
*H01L 21/02* (2006.01)
*H01L 21/762* (2006.01)
*H01L 27/092* (2006.01)
*H01L 21/8258* (2006.01)
*H01L 29/423* (2006.01)
*H01L 29/786* (2006.01)
*B82Y 10/00* (2011.01)
*B82Y 40/00* (2011.01)
*H01L 29/775* (2006.01)
*H01L 29/06* (2006.01)
*H01L 21/8238* (2006.01)

(52) U.S. Cl.
CPC .... *H01L 21/02639* (2013.01); *H01L 21/8258* (2013.01); *H01L 29/0673* (2013.01); *H01L 29/42392* (2013.01); *H01L 29/66439* (2013.01); *H01L 29/66795* (2013.01); *H01L 29/775* (2013.01); *H01L 29/78* (2013.01); *H01L 29/785* (2013.01); *H01L 29/78696* (2013.01); *H01L 21/823807* (2013.01)

(58) Field of Classification Search
USPC .......................................... 257/190; 438/478
See application file for complete search history.

(56) References Cited

U.S. PATENT DOCUMENTS

| | | | |
|---|---|---|---|
| 6,989,316 B2 | 1/2006 | Suguro et al. | |
| 7,098,477 B2 | 8/2006 | Zhu et al. | |
| 7,183,152 B1 | 2/2007 | Dakshina-Murthy et al. | |
| 7,268,058 B2 | 9/2007 | Chau et al. | |
| 7,777,250 B2* | 8/2010 | Lochtefeld | H01L 21/02647 257/190 |
| 7,799,592 B2 | 9/2010 | Lochtefeld | |
| 8,395,217 B1* | 3/2013 | Cheng | H01L 21/84 257/350 |
| 8,502,263 B2 | 8/2013 | Li et al. | |
| 8,575,653 B2 | 11/2013 | Rachmady et al. | |
| 2003/0034529 A1* | 2/2003 | Fitzgerald | H01L 21/82380 257/369 |
| 2003/0203560 A1 | 10/2003 | Ryu et al. | |
| 2005/0035415 A1* | 2/2005 | Yeo | H01L 29/66795 257/401 |
| 2005/0215014 A1 | 9/2005 | Ahn et al. | |
| 2006/0076625 A1 | 4/2006 | Lee et al. | |
| 2006/0103566 A1 | 5/2006 | Vemulapalli et al. | |
| 2006/0240622 A1 | 10/2006 | Lee et al. | |
| 2007/0262389 A1 | 11/2007 | Chau et al. | |
| 2008/0001169 A1 | 1/2008 | Lochtefeld | |
| 2008/0032506 A1 | 2/2008 | Lee | |
| 2008/0093628 A1* | 4/2008 | Lee et al. | 257/190 |
| 2008/0105925 A1* | 5/2008 | Pae | H01L 21/84 257/347 |
| 2009/0001415 A1 | 1/2009 | Lindert et al. | |
| 2009/0189694 A1 | 7/2009 | Davierwalla et al. | |
| 2009/0298245 A1* | 12/2009 | Doris | H01L 21/82380 438/216 |
| 2009/0302372 A1 | 12/2009 | Chang et al. | |
| 2010/0078680 A1 | 4/2010 | Cheng et al. | |
| 2010/0213511 A1* | 8/2010 | Lochtefeld | H01L 21/02647 257/190 |
| 2011/0049568 A1* | 3/2011 | Lochtefeld | H01L 21/02381 257/190 |
| 2011/0049613 A1 | 3/2011 | Yeh et al. | |
| 2011/0210374 A1* | 9/2011 | Lochtefeld | H01L 29/66795 257/190 |
| 2012/0074386 A1* | 3/2012 | Rachmady | B82Y 10/00 257/24 |
| 2012/0138987 A1 | 6/2012 | Shum | |
| 2012/0248529 A1* | 10/2012 | Liu | H01L 21/82348 257/334 |
| 2012/0292639 A1* | 11/2012 | Liao | H01L 21/82380 257/77 |

FOREIGN PATENT DOCUMENTS

KR  10-2011-0025075 A  3/2011
WO  WO 2010/094360 A1  8/2010

OTHER PUBLICATIONS

Office Action and Search Report from the Taiwan Intellectual Property Office (IPO) for Taiwan Patent Application No. 102133674 dated Aug. 4, 2015 and English Translation thereof.
First Office Action from the Chinese Patent Office dated Aug. 19, 2016 for Chinese Patent Application No. 201380045269.5, 7 pages.
Notice of Allowance from the Korean Intellectual Property Office (KIPO) dated Jul. 22, 2016 for Korean Patent Application No. 10-2015-7005060, 3 pages.
Office Action including Search Report dated Aug. 11, 2016 issued by the Examiner of the Intellectual Property Office (the IPO) for Taiwan Patent Application No. 104143373 (9 pages) and English Translation thereof (10 pages).
Communication of the European Patent Office dated Apr. 19, 2016 for European Patent Application No. PCT/US2013/046901, 10 pages.
Notice of Preliminary Rejection (Non-Final) from the Korean Intellectual Property Office (KIPO) dated May 2, 2016 for Korean Patent Application No. 10-2015-7005060 and English Summary thereof.
Notice of Allowance from the Taiwan Intellectual Property Office dated Dec. 20, 2016 for Taiwan Patent Application No. 104143373, 2 pages.

* cited by examiner

TRENCH CONFINED EPITAXIALLY GROWN DEVICE LAYER(S)

This is a Divisional Application of Ser. No. 13/630,527 filed Sep. 28, 2012, which is presently pending.

TECHNICAL FIELD

Embodiments of the invention are in the field of semiconductor devices and, more particularly to epitaxially grown device layers.

BACKGROUND

Transistors and other semiconductor devices may be fabricated through a number of subtractive and additive processes. Certain benefits, such as channel mobility for transistors, may be had by forming the device layers in semiconductor material other than silicon, such as germanium and III-V materials. Where a crystalline silicon substrate serves as a starting material, epitaxial growth techniques may be utilized to additively form a transistor channel region to integrate such non-silicon materials onto the silicon substrate, typically referred to as heteroepitaxy. Such epitaxial processes are challenging at least in part due to lattice mismatch and mismatch in thermal coefficients of expansion (CTE) between the seeding silicon surface and the epitaxially grown semiconductor.

Pioneers in silicon-based FET devices have now commercialized devices employing non-planar transistors which utilize a body of silicon material protruding from a substrate surface and employ a gate electrode that wraps around two, three, or even all sides of the silicon body (i.e., dual-gate, tri-gate, nanowire transistors). Source and drain regions are formed in the body, or as regrown portions coupled to the body, on either side of the gate electrode. Such non-planar designs have vastly improved channel control and associated electrical performance (e.g., short channel effect, reduced source-to-drain resistance, etc.) relative to planar silicon device designs.

It would be advantageous to integrate non-silicon materials onto the silicon substrate, particularly for non-planar transistor designs through epitaxial growth of device layers amenable to such topologies. However, techniques and structures worthy of manufacturing heteroepitaxial device layers over silicon substrates are unknown. For example, a highly subtractive process might entail a blanket epitaxial non-silicon film growth over a silicon substrate followed by an etch delineating non-silicon, non-planar bodies from which the transistors are formed. For such a technique the seeding silicon substrate has the advantage of being pristine, however such a large area growth can be challenging from a crystal defect standpoint, particularly where there is significant stress induced through thermal expansion or lattice mismatch in the epitaxial film. An alternative process might entail epitaxial growth the of non-silicon film only in regions of limited substrate area where the non-silicon, non-planar bodies are to be disposed. While such a technique may not be subject to the same issues particular to large area growths, other issues arise. For example, the seeding silicon surface may suffer damage and/or become deformed from preliminary processing of the substrate directed at delineating the regions where the epitaxial growth is to occur. Where a recess etch of the growth substrate (silicon) surface is performed, a bowl or divot shape in the seeding surface may result and subsequently impair epitaxial growth.

BRIEF DESCRIPTION OF THE DRAWINGS

Embodiments of the present invention are illustrated by way of example, and not by way of limitation, and can be more fully understood with reference to the following detailed description when considered in connection with the figures in which.

DETAILED DESCRIPTION

Non-planar transistors employing epitaxially grown device layers and methods to form the same are described. In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "in one embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not specified to be mutually exclusive.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one material layer or component with respect to other layers or components. For example, one layer disposed over (above) or under (below) another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two adjacent features may be in direct contact with the adjacent features or may have one or more intervening features.

Figure 1:
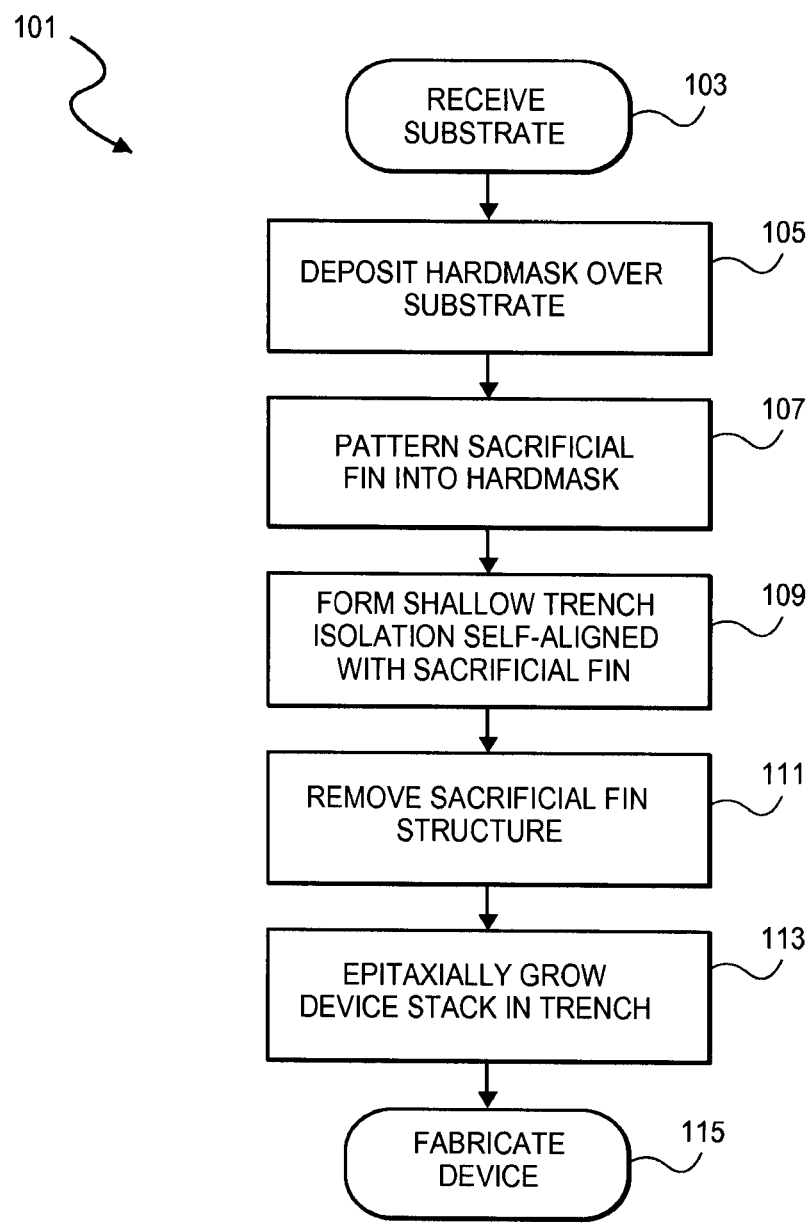
FIG. 1 illustrates a flow chart diagramming selected operations in a method of epitaxially growing a device layer(s), in accordance with an embodiment of the present invention.

FIG. 1 illustrates a flow chart of selected operations in a method 101 for epitaxially growing a device layer(s), in accordance with an embodiment of the present invention. FIGS. 2A-2G, illustrate cross-sections of a region over a substrate as operations from the method illustrated in FIG. 1 are performed, in accordance with an embodiment of the present invention. The FIGS. 1 and 2A-2G are referred to alternately to provide a concise description of both fabrication techniques and salient resultant structural features.

The method 101 is generally a trench-confined selective epitaxial growth process in which epitaxial growth of a semiconductor device layer(s) proceeds within the confines of a trench. Such trench-confined growths can offer an advantage of aspect ratio trapping (ATR) whereby crystalline quality of the epitaxial layer(s) is enhanced through trapping of threading dislocations, stacking faults, twins, etc., at sidewalls of the trench where defects terminate such that overlying layers may be increasingly defect-free and adjacent device layer(s) grown in separate trenches may grow concurrently in a more independent, or isolated, manner. Delination of a number of such trenches, having at least one relatively small dimension (e.g., 2 nm-100 nm) for best ATR may enable heteroepitaxial processes with lower defect denisties for a given amount of thermal and lattice mismatch between a seeding crystal and the epitaxially grown crystal(s) in the device layer(s).

It has been further found by the inventors that the trench-confined epitaxial film quality is highly dependent on characteristics of the confining trench (e.g., sidewall angles of trench, corner rounding of trench, and bottom bowling of the trench) in which the epitaxial film layer(s) is grown. In contrast to a trench forming technique whereby some amount of the growth substrate is recessed etched and selective epitaxy then performed upon a recess-etched semiconductor seeding surface, the method 101 has been found to advantageously provide excellent trench aspect ratio and sidewall angle control while also maintaining a pristine, planar, non-recessed etched epitaxial growth seeding surface for higher quality, better controlled epitaxial device layers.

Figure 2A:
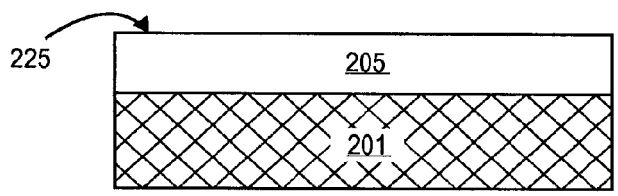
FIGS. 2A-2G, illustrate cross-sections of a region over a substrate where a trench-confined epitaxial device stack is formed as operations from the method illustrated in FIG. 1 are performed, in accordance with an embodiment of the present invention.
Figure 2A:
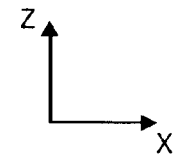
Figure 2B:
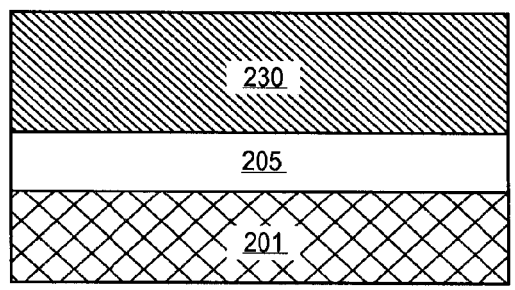
Figure 2B:
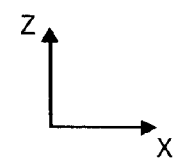

Referring to FIG. 1A, the method 101 begins with receiving a growth substrate at operation 103. Generally, the growth substrate may be composed of any material suitable for semiconductor device fabrication as the techniques described herein are broadly applicable to any known growth substrate, such as, but not limited to, silicon, germanium, silicon-germanium, silicon carbide, sapphire, a III-V compound semiconductor, or the like. An exemplary growth substrate is further illustrated in FIG. 2A. In this embodiment, the growth substrate includes a bulk substrate 201 composed of (single) crystalline silicon (e.g., (100) silicon). Disposed over the bulk substrate 201 is one or more semiconductor base layers 205, such as but not limited to pseudomorphic, metamorphic, or substantially lattice matched buffer layers and/or transition layers, as known in the art. Embodiments of the present invention are not limited with respect to the structure and/or composition of base layers 205. As shown in FIG. 2A, whatever the exact structure of the growth substrate, there is an epitaxial seeding surface 225 present on the growth substrate received at operation 103 (FIG. 1). The seeding surface 225 may be, for example, a crystalline SiGe surface having (100) crystal orientation, etc.

Continuing with the method 101, a hardmask film is blanket deposited over the growth substrate at operation 105. Generally, the hardmask film is to be of a material that can be readily removed from the growth substrate without damage to the growth substrate (i.e., removable through a process highly selective over the underlying growth substrate material) and can be anisotropically etched for well-controlled sidewall angles, smoothness, and CD control. As described further elsewhere herein, one of the functions of the hardmask film is to protect the seeding surface of the underlying semiconductor surface from which epitaxial layer growth will initiate. Another function of the hardmask film is to ultimately define sidewall angles of a trench in which epitaxy will occur.

In one embodiment where the growth substrate surface includes lattice constituents other than silicon (e.g., a SiGe alloy), the hardmask film includes a layer of polysilicon (p-Si) or amorphous silicon (a-Si). In another embodiment, the hardmask film includes a layer of silicon nitride. The thickness (z-height) of the hardmask film may vary as a function of the technology to achieve a desired aspect ratio (i.e., thickness: lateral critical dimension) in features subsequently formed in the hardmask film. The deposition processes employed to form the hardmask film may be any known in the art to be applicable for these exemplary materials or any other suitable alternative material. An exemplary growth substrate is further illustrated in FIG. 2B. In this embodiment, the hardmask film 230 is deposited directly on the base layer 205 (i.e., in direct contact with the seeding surface 225). In the illustrated embodiment, the hardmask film 230 is a single homogenous layer and such an embodiment is suitable where the underlying semiconductor includes elements other than silicon (e.g., as an alloy of silicon, or a silicon free semiconductor) to ensure good etch selectivity to the underlying semiconductor seeding surface 225. In certain such exemplary embodiments, the thickness of the hardmask film 230 is over 50 nm and may further be over 500 nm, depending on the margin needed to arrive at a trench with proper aspect ratio.

In further embodiments, the hardmask film may include one or more layers to form a multi-layered material stack. Generally, a bulk layer of a material offering good etch characteristics from the standpoint of CD control, sidewall angle control, edge roughness, etc. may be disposed on an underlying base layer that is directly in contact with the seeding surface of the growth substrate. The hardmask base layer may be thinner than the bulk layer and of any material suitable as an etch stop, permitting the bulk layer material and/or etch process to have lower etch selectivity over the semiconductor substrate. As one example, a thin oxide layer (e.g., $SiO_2$, $GeO_2$, $Si_xGe_{1-x}O_y$), or oxynitride layer (e.g., SiON, GeON, $Si_xGe_{1-x}O_yN_z$) may be disposed between a bulk hardmask layer and the underlying growth substrate surface. For example, referring to FIG. 2B the hardmask film 230 may include an oxide layer directly on the seeding surface 225 and a p-Si, a-Si, or silicon nitride, layer disposed directly on the oxide layer. For such embodiments, the thickness of the oxide layer may vary from a native oxide thickness on the order of 1 nm to a thermally grown oxide or chemically deposited oxide (e.g., by CVD/PECVD) of 2-3 nm, or more.

Continuing with the method 101, at operation 107 the hardmask film is patterned into a hardmask fin. The hardmask fin is sacrificial and is to serve as a mandrel for subsequent processing. The fin is generally to have the inverse pattern of a trench that is advantageous for confinement of a subsequent epitaxial growth, and therefore both the footprint of the fin and the sidewall angle of the fin are of interest. Standard lithographic patterning techniques may be combined with known anisotropic dry plasma etches of the hardmask film to pattern the hardmask film into the sacrificial hardmask fin(s).

Figure 2C:
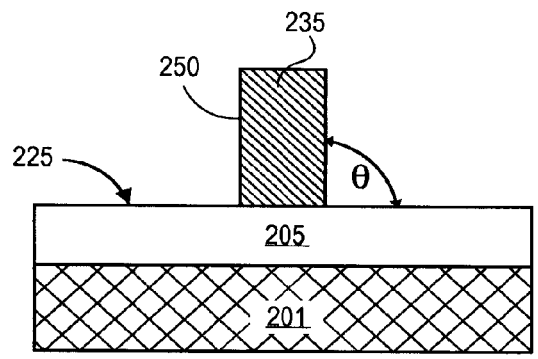
Figure 2C:
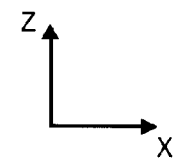

The FIG. 2C illustrates one exemplary embodiment where the hardmask film 230 is anisotropically etched into a hardmask fin 235 having sidewalls 250, exposing the surrounding seeding surface 225 either during anisotropic etch of the hardmask film 230 or by a separate etch of an etch stop layer (e.g., thin CVD oxide) for embodiments where the hardmask film 230 is a multilayered stack. Alternatively, the etch stop layer may be left on the surrounding semiconductor surface. It is currently thought that ART is most successful when initial seeding surfaces are disposed within a trench having an aspect ratio of at least 2:1 and preferably more than 4:1. In exemplary embodiments where the hardmask film 230 has a thickness of 50-500 nm, the hardmask fin 235 may have lateral critical dimensions in the range of 2 nm-100 nm (e.g., in the x-axis of FIG. 2C) for an aspect ratio of between approximately 5 and 10.

In advantageous embodiments, sidewalls of the hardmask fin are approximately normal to the top surface of the underlying growth substrate. For example, in FIG. 2C, the sidewalls 250 have a sidewall angle θ that is approximately 90° (e.g., 88-92°) to the seeding surface 225. Vertical fin sidewalls have been found advantageous for subsequently defining sidewalls of a trench, as described further elsewhere herein. In alternative embodiments, the sidewall angle θ is slightly positively sloped with a base of the hardmask fin being of larger dimension than a top portion (i.e., not reentrant). For example, in FIG. 2C, the sidewalls 250 may be sloped to a sidewall angle θ of 100-120°.

Returning to FIG. 1A, the method 101 proceeds to operation 109 where isolation is formed in a manner self-aligned to the hardmask fin. In the exemplary embodiment, operation 109 entails depositing an isolation dielectric film is over the hardmask fin and then planarizing the isolation dielectric to expose the hardmask fin. In embodiments where the isolation dielectric is deposited conformally, the dielectric forms sidewalls complementary to those of the hardmask fin (e.g., sidewalls 250 illustrated in FIG. 2D) such that a negative of the etch profile achieved for the hardmask fin is translated into the isolation dielectric film. Therefore, where the etch of the hardmask fin is well-controlled to provide non-re-entrant sidewalls (e.g., normal or positively sloped), the conformal isolation dielectric surrounding the hardmask fin is similarly capable of forming well-controlled sidewall angles (e.g., normal or re-entrant) with the inverse pattern.

Figure 2D:
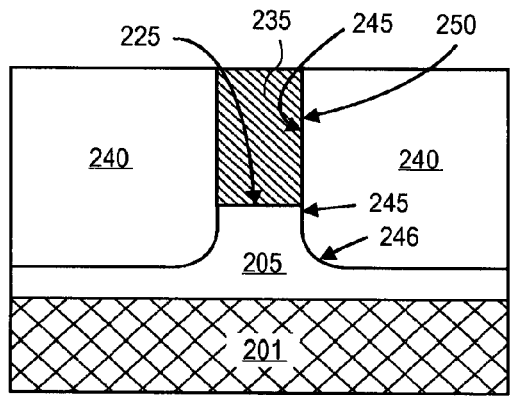
Figure 2D:
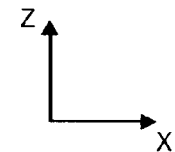

In a further embodiments, the isolation dielectric is recessed below the growth substrate seeding surface. For such embodiments formation of the isolation dielectric at operation 109 further comprises etching of the semiconductor substrate not protected by the hardmask fin. As shown in FIG. 2D, this shallow trench isolation etching removes some of the growth substrate in a manner self-aligned to the hardmask fin 235, and more particularly removes some of the base semiconductor layer 205 (e.g., buffer). The etching of the growth substrate may proceed by any technique known in the art to be applicable for the growth substrate material system. In exemplary embodiments, an anisotropic etch, such as a plasma etch, of the growth substrate is performed to maintain fidelity between the semiconductor seeding surface sidewall 245 and the hardmask sidewall 250. For example, where the base layer 205 is a SiGe alloy (e.g., $Si_{0.7}Ge_{0.3}$), a dry etch is performed to advance the etch front past the seeding surface 225. In the exemplary embodiment illustrated, corner rounding 246 typical in timed etches terminated before a film is cleared (e.g., before the base layer 205 is cleared) is recessed below the seeding surface 225. Such recessing of the growth substrate may, for example, advantageously reduce leakage currents between neighboring devices occurring through a pathway in top levels of the growth substrate (e.g., through base layer 205). Such recessing of the growth substrate may further enable engineering of the film stress present at the seeding surface 225, for example by reducing the physical coupling between the seeding surface 225 and surrounding base layer 205 (in effect placing the seeding surface 225 atop a semiconductor pedestal or mesa), and/or by enabling a well-controlled stress-engineered isolation dielectric 240 (designed to be either tensile or compressive, depending on the embodiment) to be disposed adjacent to the seeding surface sidewall 245. Depending on the x-y dimensions of the hardmask fin 235, such stress may be more or less uniaxial or biaxial.

In embodiments, the operation 109 entails a conformal deposition of one or more layers of dielectric material, such as but not limited to chemical vapor deposited (e.g., CVD, PECVD) oxide (e.g., $SiO_2$). Where more than one layer is deposited, a thin etch stop dielectric (e.g., silicon nitride) may be deposited within a bulk dielectric (e.g., $SiO_2$). After conventional planarization techniques (e.g., CMP), the deposited dielectric has a top surface planar with a top surface of the hardmask fin, as illustrated in FIG. 2D.

Continuing with the method 101, at operation 111 the hardmask fin is removed selectively to the isolation dielectric and the growth substrate to expose the semiconductor seeding surface. Material differences between the hardmask fin, isolation dielectric, and growth substrate facilitate an etch of the hardmask fin that is highly selective to the hard mask fin, ensuring the epitaxial seeding surface is un-etched (non-recessed), undamaged, and therefore with the high planarity typical of a starting substrate (e.g., substantially as received at operation 103). As further illustrated in FIG. 2E, the pristine seeding surface 225 is exposed at a bottom of the trench 260 with the sidewalls 250 well-controlled as a result of high etch selectivity associated with the hardmask fin etch. This processing, and resulting structural characteristic, is in stark contrast to alternative processing whereby a top surface of a growth substrate is recess etched relative a surrounding isolation dielectric, or other region of the growth substrate, to form a trench in which subsequent epitaxial growth may be performed. It has been found such a semiconductor recess etch may damage the semiconductor surface in a manner detrimental to subsequent epitaxial growth. For example, micro-trenching (localized accelerated etching) may lead to bowling of the bottom semiconductor surface and/or trench corner rounding. With embodiments of the present invention however, no recess of the seeding surface (e.g., 225 in FIG. 2E) is performed such that the seeding surface is an un-etched semiconductor surface.

In the exemplary embodiment where the base layer 205 is a SiGe alloy, and the isolation dielectric 240 is SiO$_2$, p-Si hardmask materials, as well as silicon nitride hardmask materials, can be readily removed with selectivities of 20-30:1, or more, with an isotropic, low-energy etch (e.g., downstream plasma-based, wet chemistry-based, etc.). In further embodiments, where the hardmask film is a stack (e.g., a bulk layer of p-Si or silicon nitride disposed over thin oxide), removal of the hardmask fin at operation 111 may entail a first and second etch, with the thin base layer of the hardmask fin removed with a high selectivity etch (20-30:1, or more, over the growth substrate). In embodiments, following operation 111 the trench 260 in which the seeding surface is disposed has an aspect ratio (z-height:x-critical lateral dimension) of at least 5:1, and may be 10:1, or more, with sidewalls 250 substantially normal to the seeding surface 225, or slightly re-entrant. In embodiments where the x-dimension of the trench 260 is between 2 nm and 100 nm, the z-height of the trench 260 is between 50 nm and 500 nm.

The method 101 (FIG. 1) continues at operation 113 with epitaxial growth of a crystalline semiconductor device layer, or plurality of layers, within the fabricated trench. Generally, the device layer(s) grown at operation 113 may be any known in art using any epitaxy technique known for the chosen materials (e.g., by metalorganic chemic vapor deposition-MOCVD, molecular beam epitaxy (MBE), etc.). In exemplary embodiments, the epitaxial semiconductor layers are strained by lattice and/or CTE mismatch with the seeding crystal surface. For embodiments where more than one device layer is epitaxially grown, lattice and/or CTE mismatch may further exist between epitaxial device layers. As employed herein, an "epitaxial" layer is in registry with the seeding surface (e.g., having a preferred crystal orientation as a result of the crystallinity of the seeding surface). In certain embodiments where the seeding surface has (100) orientation, the epitaxial device layers also have (100) orientation. Because the epitaxial growth is confined within the trench 260, the semiconductor device layer(s) will have sidewalls complementary to those of the sidewalls 250 in the dielectric 240. Regardless of the compositional layers present, the device layer(s) may have substantially normal sidewalls relative to the seeding surface 225, or be slightly positively sloped (e.g., 10-20 off normal) where the sidewalls 250 are re-entrant. With trench-confined epitaxial growth at operation 113, defects may run out toward the interface with the sidewalls 250. Such directed run out would be absent had epitaxy not been trench confined (e.g., with a blanket growth were no trench interfaces would be present). Furthermore, with trench-confined epitaxial growth, crystal defect density within the epitaxial layers formed over the seeding surface may be progressively lower at points in the device layer(s) more distal from the seeding surface.

Figure 2E:
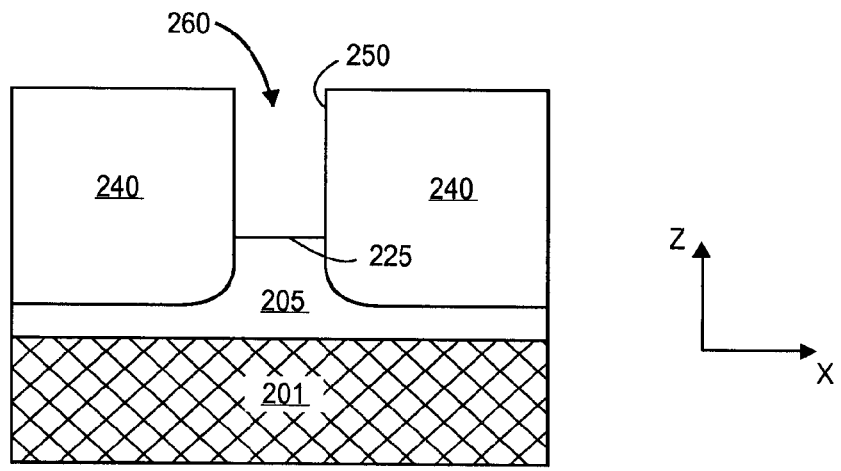
Figure 2F:
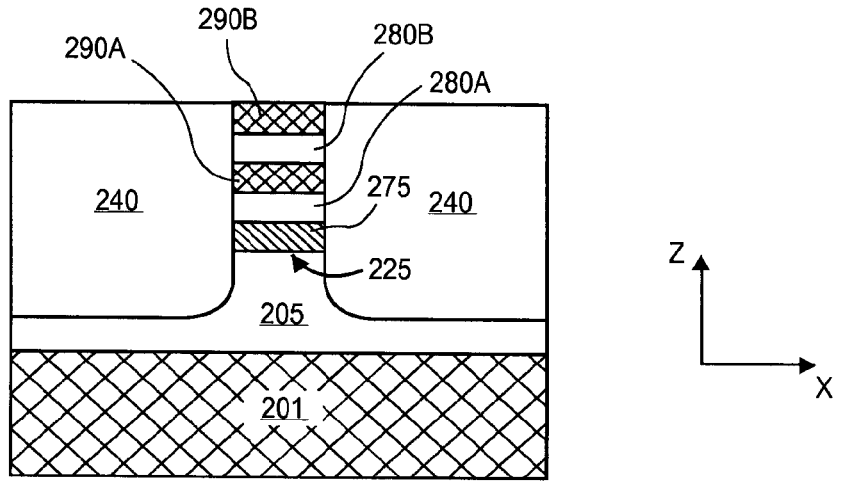

In one exemplary embodiment, a device layer(s) grown at operation 113 includes at least one high mobility channel layer epitaxially grown over (or directly on) the seeding surface. The high mobility layer may part of a quantum-well structure (e.g., two or three epitaxial layers of differing band gaps) grown at operation 113 directly on the seeding surface of the growth substrate, for example as part of device layers suitable for a high carrier mobility transistor embodiment. Or, as illustrated in FIG. 2F, the device layer(s) may include a number of channel layers, all epitaxially grown within the confines of trench 260, for example to form a stacked nanowire transistor device. Alternatively, the embodiment illustrated in FIG. 2F may be the less complex case where only a single channel layer is formed as for a more typical planar transistor channel structure well-known in the art. Hence, FIG. 2F is meant to represent both a planar embodiment as well as a stacked nano-wire embodiment as the planar embodiment may be considered a first layer of the nanowire embodiment depicted.

For one embodiment where the base layer 205 is a SiGe alloy, a high hole mobility channel layer 280A composed of Ge is selectively grown over the seeding surface 225. While the channel layer 280A in some embodiments is grown directly on the seeding surface 225 (e.g., for a planar transistor embodiment), for the stacked nanowire embodiment illustrated in FIG. 2F, an intervening semiconductor layer 275 is disposed (grown) between the channel layer 280A and seeding surface 225. The intervening semiconductor layer 275 may be of a composition that enables it to be removed selectively to the channel layer 280A (and vice versa). While the epitaxial device layer(s) may include any number of channel layers grown within the confines of the trench 260, for the illustrated embodiment, a second channel layer 280B is grown over the channel layer 280A with an intervening crystalline layer 290A. In an embodiment the channel layers 280A and 280B are of a same composition, however the intervening layer 290A is of differing composition and may not be of the same composition as the intervening layer 275. Finally, over the second channel 280A is another epitaxial semiconductor layer 290B, which in one embodiment is of the same composition as the layer 290A, and more particularly may be of a material having high electron mobility, such as a known III-V alloy reasonably lattice matched to the channel layers 280A, 280B (e.g., any binary ternary or quaternary compound, such as, but not limited to, InAs, InAsSb, InSb, AlGaAs, GaAs, etc.). Such a device stack may enable a CMOS implementation where layers 290A and 290B serve as nMOS device channels and layers 280A and 280B serve as pMOS device channels. For planar transistor embodiments, the single channel layer 280A (or 290A) would be the only semiconductor device layer, disposed directly on the seeding surface 225, and grown to a thickness relative to the surrounding isolation dielectric 240 that is comparable to the nanowire stack depicted. As an example, a planar transistor implementation is illustrated in FIG. 3C.

In embodiments, operation 113 further includes planarization to remove any semiconductor overgrowth extending above/beyond the adjacent isolation dielectric. For example, FIG. 2F illustrates an exemplary nanowire semiconductor device stack with a top surface substantially planar with surrounding isolation dielectric 240. After such planarization, the top surface of the epitaxially grown semiconductor (e.g., top surface 291 in FIG. 2G) may be disposed from the seeding surface a distance that is a significant portion of the depth of the trench 260 (FIG. 2E). For example, in embodiments, the top surface of the planarized epitaxial device layer may be 40 nm-400 nm from the seeding surface, or more than three times a minimum lateral dimension of the seeding surface (e.g., x-dimension in the FIG. 2G).

The method 101 (FIG. 1) then completes at operation 115 with fabrication of a device in or on the epitaxial semiconductor. Such fabrication may vary as a function of the device and/or device layer(s). In certain embodiments, such as a non-planar embodiment as illustrated in FIG. 2F, operation 115 entails recessing of the isolation dielectric top surface 241 selectively to the device layer(s) to expose one or more sidewalls of one or more semiconductor layers in the device layer(s), rendering each trench-confined epitaxial device stack a non-planar semiconductor body extending above a surrounding isolation dielectric. Recessed isolation dielectric is thinned relative to the thickness it had in its roles as a confining trench, but the thickness retained may be adequate for electrical device isolation where the growth substrate portions not utilized as a seeding surface (i.e., unprotected by the hardmask fin) have been recessed below the seeding surface (e.g., during the operation 109 in FIG. 1). Any etching technique known in the art applicable to recess the isolation dielectric material may be utilized. For example, a timed wet or dry $SiO_2$ etch may be used or, in embodiments where a etch stop layer is incorporated into a multi-layered isolation dielectric, the isolation recess etch may be stopped on the etch stop layer with the stop layer either subsequently removed or left as an artifact within the isolation regions. In the embodiment shown in FIG. 2G, the channel layers 280A and 280B are both exposed above the isolation top surface 241 upon completion of the isolation dielectric recessing process.

Figure 2G:
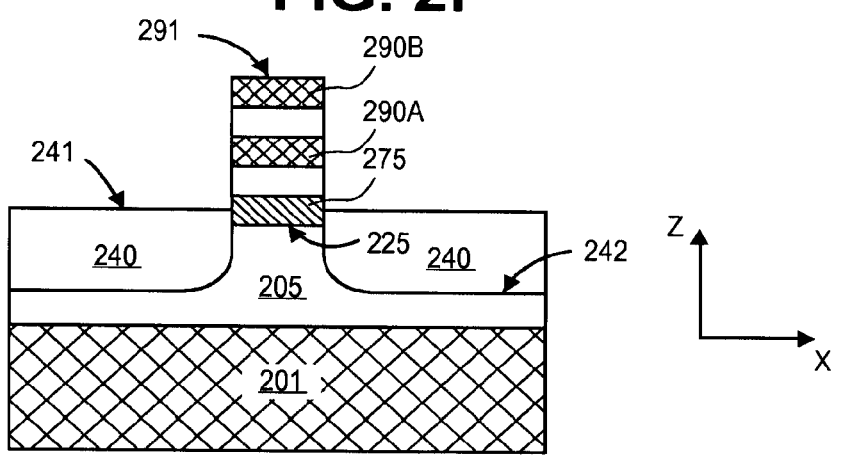
Figure 2H:
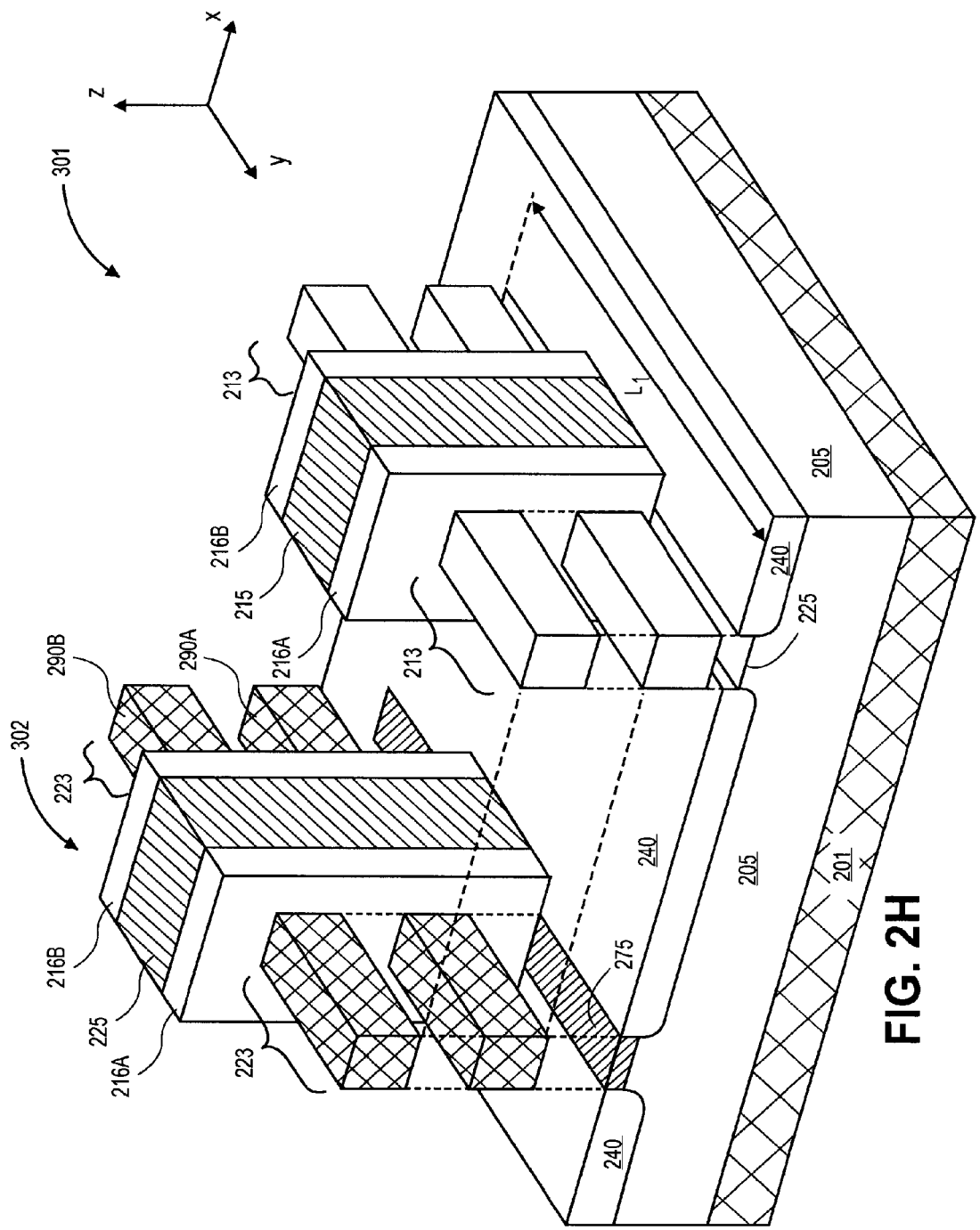
FIG. 2H is an isometric view illustrating complementary trench-confined epitaxial device structures, in accordance with a CMOS embodiment.

FIG. 2H is an isometric view illustrating a trench-confined epitaxial device stack, in accordance with a CMOS embodiment. FIG. 2H represents one technique that may be applied to form high mobility transistors of complementary carrier type from trench-confined epitaxial device layers. The CMOS implementation in FIG. 2H includes a pMOS nanowire structure 301 and an nMOS nanowire structure 302. Again, a similar CMOS structure including a planar pMOS transistor structure and a planar nMOS transistor structure may similarly be formed (e.g., using only single channel layer growths over respective seeding surfaces).

In one nanowire embodiment, the pMOS nanowire structure 251 is evolved from the device stack illustrated in FIG. 2G. As shown, sacrificial channel masking mandrel structures 215 may be formed around the a center region of the device stacks (e.g., within a center of the y-dimension) and alternating layers of the device layer(s) sacrificial for the transistor carrier type (e.g., layers 275, 290A, 290B for the pMOS structure 251, or layers 280A, 280B for the nMOS structure 252) are then etched while the center portion is protected by the masking mandrel structures 215. Doped semiconductor may then be deposited (or grown) over exposed ends 213, 223, of the channel layers 280A and 280B, which may be heavily doped at some point in the process. Alternatively, the ends 213, 223 may be replaced (regrown) all together. The channel masking mandrel structures 215 may then be removed (not depicted), and with a non-sacrificial spacer dielectric 216A, 216B, 226A, 226B, and/or source/drain semiconductor, and/or contact metal anchoring the device layer(s), a semiconductor etch is performed a second time (e.g., etching away layers 275, 290A, 290B in the pMOS structure 251 and layers 280A, 280B in the nMOS structure 252) to expose the channel layers of the complementary structures. A non-sacrificial gate stack comprising a conformal gate dielectric layer and a gate electrode layer(s) is then formed over the exposed channel layers, using conventional techniques, such as, but not limited to, atomic layer deposition (ALD). In exemplary embodiments, the first and second gate dielectrics are deposited conformally, backfilling any voids between device layers, to wrap completely around surfaces of the semiconductor channels extending between the sources and drains.

Notably, while the illustration in FIG. 2H depicts the pMOS and nMOS devices 301, 302 in a same state, such states may not occur concurrently where serial processing one of the structures proceeds that of the other (e.g., the processing described above can be performed multiple times with alternative between retention of the semiconductor layers 290A, 290B, and the layer 280A, 280B, as complementary channel layers, in separate regions of the substrate). In this manner, a plurality of trenches defined across a substrate based on a same epitaxial device stack may serve as a basis for both pMOS and nMOS high mobility devices. In one such embodiment, within at least a channel region, each of the pMOS nanowire layers 280A, 280B is of the same group IV semiconductor material (e.g., Ge). Likewise, within a channel region, each of the nMOS nanowire layers 290A, 290B is of the same group III-V semiconductor material (e.g., GaAs). In an alternative embodiment, each of the pMOS nanowire layers 280A, 280B is of the same group IV semiconductor material (e.g., Ge) while each of the nMOS nanowire layers 290A, 290B is of the same group IV semiconductor material (e.g., Si).

With a single trench-confined heteroepitaxial stack where the channel layer of one transistor type serves as the sacrificial layer adjacent to a channel layer of the other transistor type, a first semiconductor channel will have a top surface disposed a first distance from the seeding surface and a second semiconductor channel, of complementary conductivity type, will have a top surface disposed a second distance (either more or less than the first) from the seeding surface.

Figure 3A:
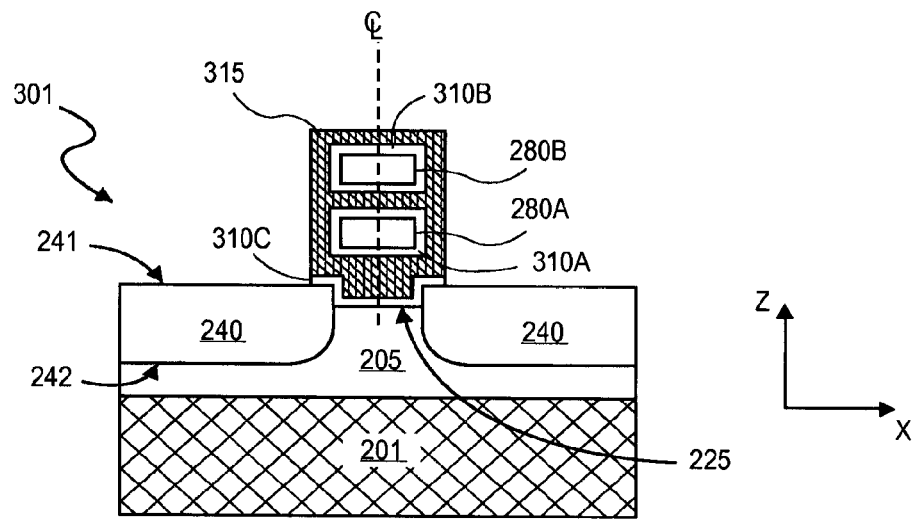
FIG. 3A illustrates a cross-section along a first dimension of a non-planar transistor employing a device layer(s) grown by the method illustrated in FIG. 1, in accordance with an embodiment of the present invention.
Figure 3B:
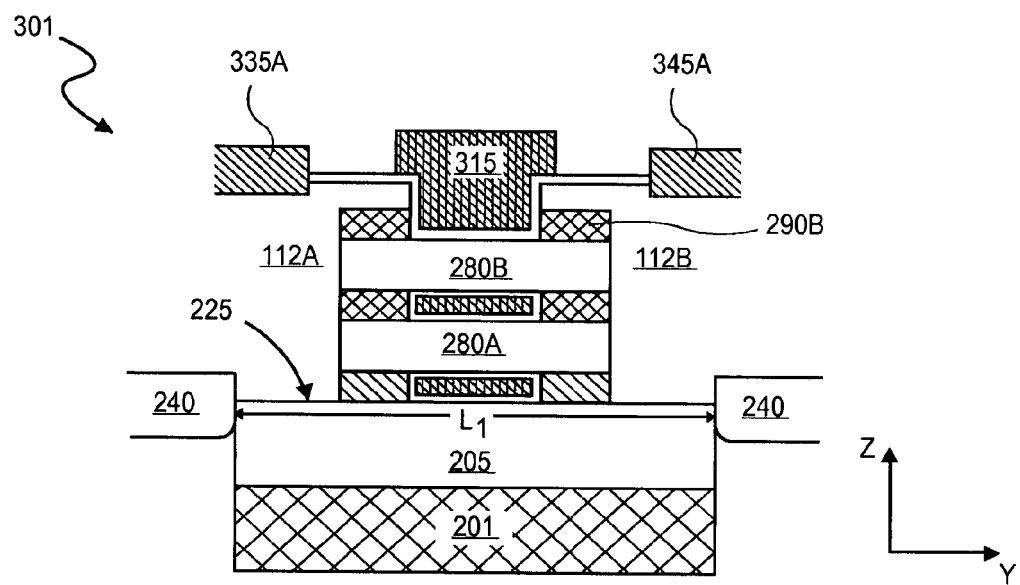
FIG. 3B illustrates a cross-section along a second dimension of the non-planar transistor illustrated in FIG. 3A, in accordance with an embodiment of the present invention.
Figure 3C:
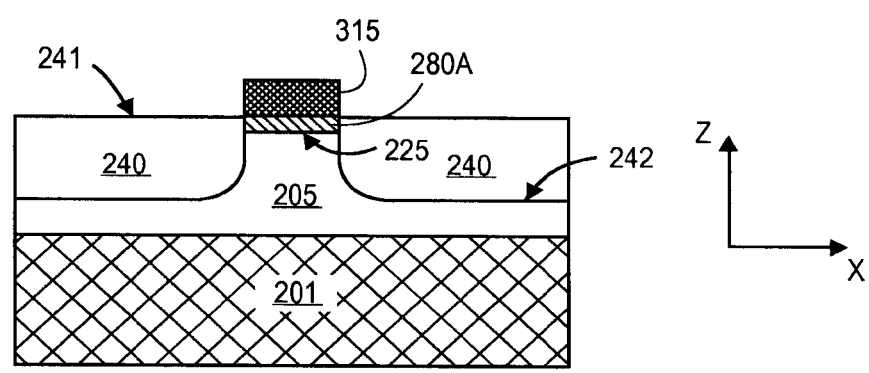
FIG. 3C illustrates a cross-section along a first dimension of a planar transistor employing a device layer grown by the method illustrated in FIG. 1, in accordance with an embodiment of the present invention.

FIG. 3A illustrates a cross-section along a first (x) dimension of the non-planar pMOS transistor 301 employing a trench confined device layer grown by an embodiment illustrated by FIG. 1, in accordance with an embodiment of the present invention. FIG. 3B depicts a cross-section along a second (y) dimension of the non-planar pMOS transistor 301, in accordance with an embodiment of the present invention. In the exemplary embodiment, the pMOS transistor 301 is evolved during the operation 115 (FIG. 1) from the pMOS structure 251 (FIG. 2H). FIG. 3C illustrates a cross-section along a first dimension of a planar transistor employing a device layer grown by the method illustrated in FIG. 1, in accordance with an embodiment of the present invention.

As denoted in FIG. 3A, because of the trench-confined epitaxial growth, a center (denoted by centerline CL) of the channel layers 280A, 280B extends through a center of the seeding surface 225 disposed between the isolation dielectric 240. In addition to the co-incident centers, the planarity of the seeding surface 225 is indicative of the method 101. As further illustrated in FIG. 3A, the seeding surface 225 is recessed relative to an isolation dielectric top surface 241 while the bottom isolation surface 242 is interfaces with the underlying semiconductor at a level below that of the seeding surface 225. As illustrated in FIG. 3B, the seeding surface 225 has a length $L_1$ in the y-dimension defined by the adjacent isolation dielectric 240. Along this axis too, the seeding surface 225 is aligned with a center of the device layers defining the channel layers 280A, 280B that extend between the semiconductor source and drains 112A, 112B. The seeding surface 225 is also planar along its entire length $L_1$, as a result of trench-confined growth performed upon a non-recessed, un-etched growth substrate surface. Such planarity in the base layer 205 would be absent had an un-stopped semiconductor recess etch been performed (e.g., instead corner rounding proximate the interface of the isolation dielectric 240 would be present). As illustrated in both FIGS. 3A and 3B, recesses formed by etching sacrificial semiconductor layers within the device stack are back-filled with gate dielectric 310A, 310B, 310C (e.g., 310A surrounding channel layer 280A and 310B surrounding channel layer 280B) and gate electrode material(s) 315.

Contact metallization 335A, 345A is further deposited in contact with the source and drains 112A, 112B.

As illustrated in FIG. 3C, for planar transistor embodiments, the single channel layer 280A (or 290A) would be the only semiconductor device layer, disposed directly on the seeding surface 225, and grown to a thickness relative to the surrounding isolation dielectric 240 to arrive at a planar surface across the isolation dielectric 240 and channel layer 280A.

Figure 4:
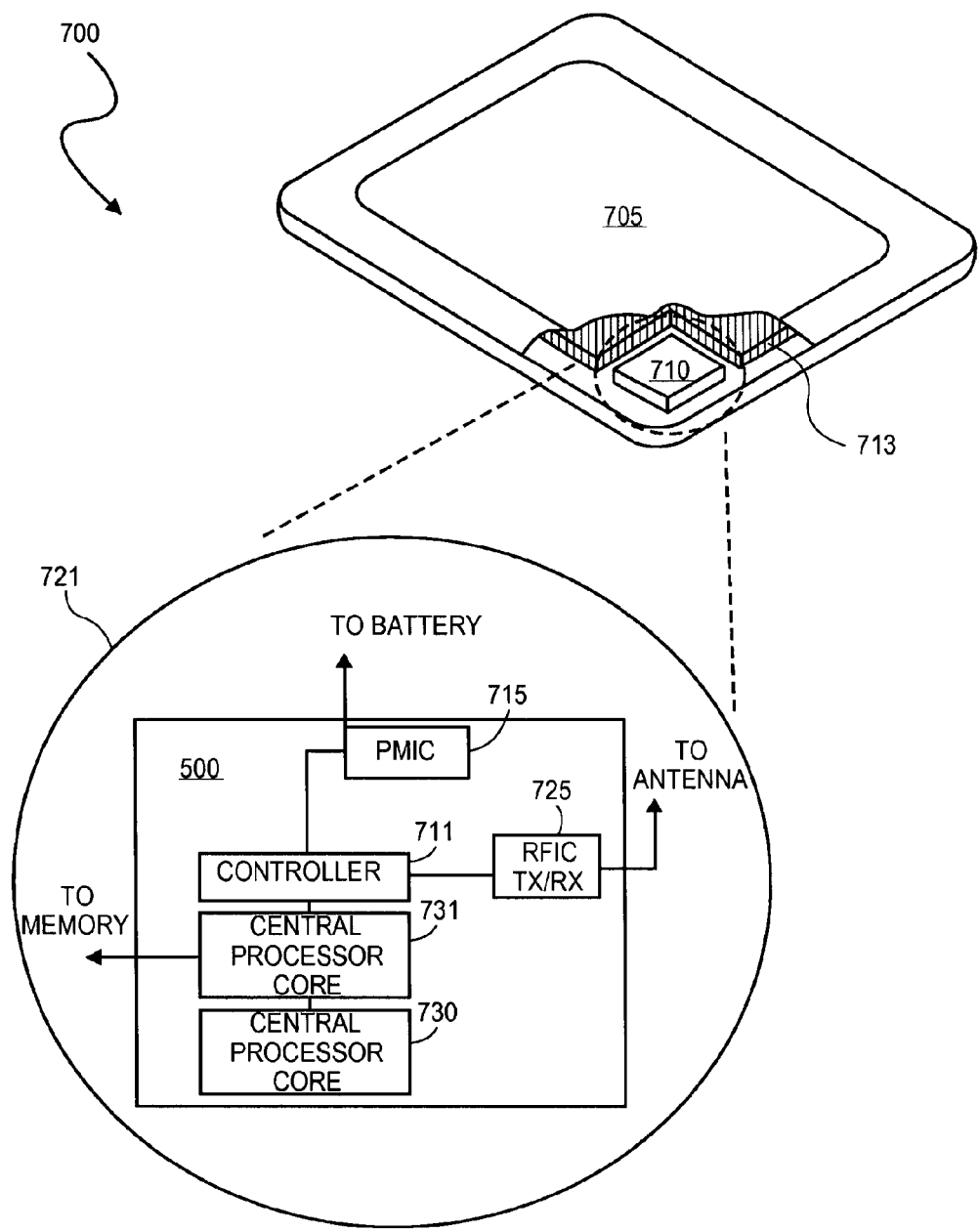
FIG. 4 illustrates an isometric view of a mobile computing device platform and schematic view of a microelectronic device employed by the mobile platform, in accordance with an embodiment of the present invention.

FIG. 4 illustrates an isometric view of a mobile computing device platform 700 and schematic view 721 of a microelectronic device 710 employed by the mobile platform, in accordance with an embodiment of the present invention. The mobile computing platform 700 may be any portable device configured for each of electronic data display, electronic data processing, and wireless electronic data transmission. For example, mobile computing platform 700 may be any of a tablet, a smart phone, laptop computer, etc. and includes a display screen 705 which in the exemplary embodiment is a touchscreen (capacitive, inductive, resistive, etc.), a chip-level (SoC) or package-level integrated microelectronic device 710, and a battery 713.

The integrated device 710 is further illustrated in the expanded view 721. In the exemplary embodiment, the device 710 includes at least one memory at least one processor chip (e.g., a multi-core microprocessor and/or graphics processor cores 730, 731). The term "processor" may refer to any device or portion of a device that processes electronic data from registers and/or memory to transform that electronic data into other electronic data that may be stored in registers and/or memory. In embodiments, one or more transistors in the processor chip, or memory, includes a heteroepitaxial channel layer disposed over a planar seeding layer with isolation dielectric forming a perimeter around the seeding layer, as described in more detail elsewhere herein (e.g., FIGS. 3A, 3B), integrated into the device 710. The device 710 is further coupled to the board, substrate, or interposer 500 along with, one or more of a power management integrated circuit (PMIC) 715, RF (wireless) integrated circuit (RFIC) 725 including a wideband RF (wireless) transmitter and/or receiver (e.g., including a digital baseband and an analog front end module further comprises a power amplifier on a transmit path and a low noise amplifier on a receive path), and a controller thereof 711. Functionally, the PMIC 715 performs battery power regulation, DC-to-DC conversion, etc., and so has an input coupled to the battery 713 and with an output providing a current supply to all the other functional modules. As further illustrated, in the exemplary embodiment the RFIC 725 has an output coupled to an antenna to provide to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In implementations, each of these modules may be integrated onto a single chip as an SoC, onto separate ICs coupled to a package substrate of the packaged device 710, or at a board level.

Figure 5:
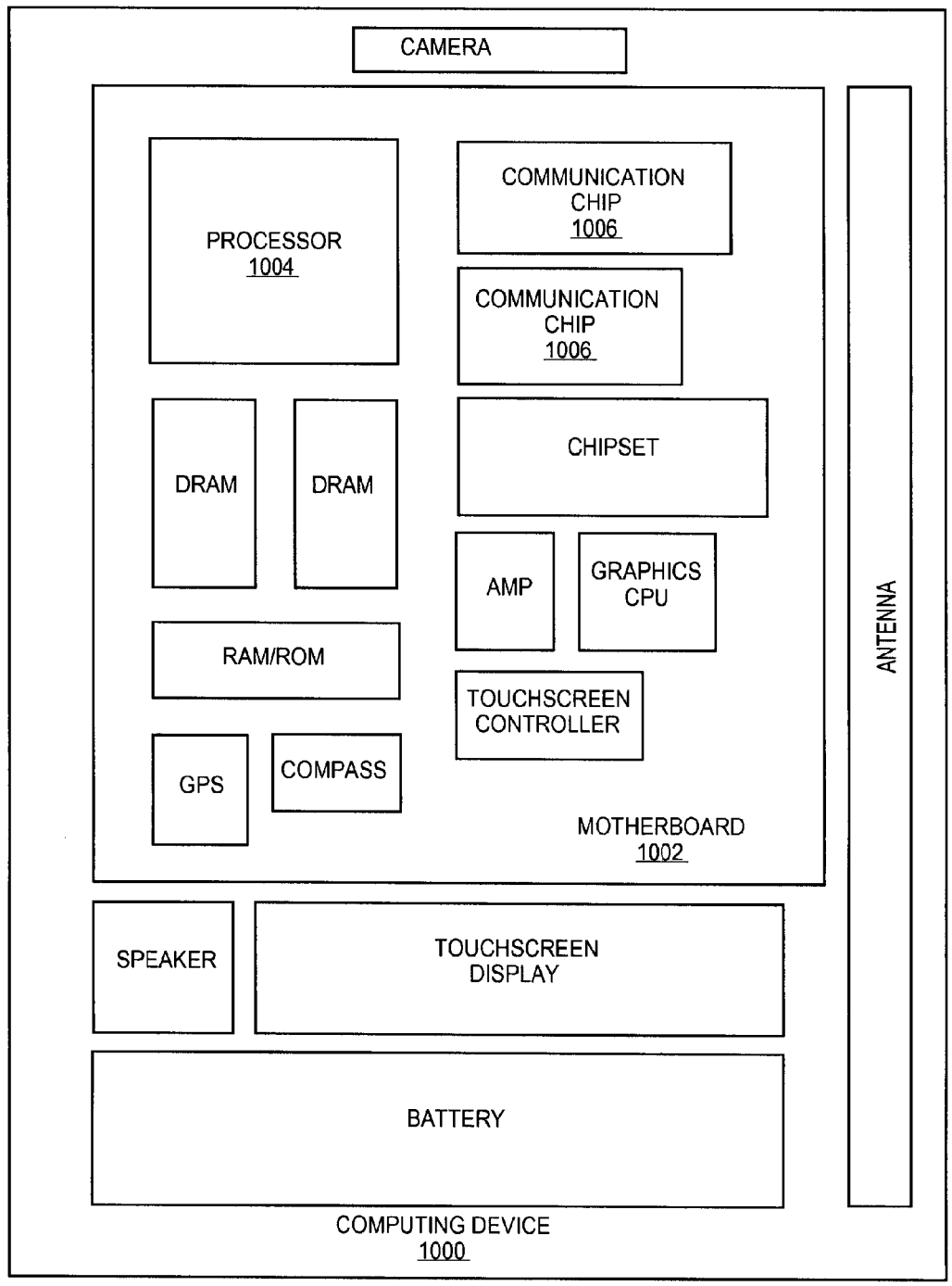
FIG. 5 illustrates a functional block diagram of computing device in accordance with one implementation of the invention.

FIG. 5 is a functional block diagram of a computing device 1000 in accordance with one embodiment of the invention. The computing device 1000 may be found inside the platform 700, for example, and further includes a board 1002 hosting a number of components, such as but not limited to a processor 1004 (e.g., an applications processor) and at least one communication chip 1006. In embodiments, at least the processor 1004 is integrated (e.g., on-chip) with one or more transistors in the processor chip, or memory, includes a heteroepitaxial channel layer disposed over a planar seeding layer with isolation dielectric forming a perimeter around the seeding layer, in accordance with embodiments describe elsewhere herein. The processor 1004 is physically and electrically coupled to the board 1002. The processor 1004 includes an integrated circuit die packaged within the processor 1004.

In some implementations the at least one communication chip 1006 is also physically and electrically coupled to the board 1002. In further implementations, the communication chip 1006 is part of the processor 1004. Depending on its applications, computing device 1000 may include other components that may or may not be physically and electrically coupled to the board 1002. These other components include, but are not limited to, volatile memory (e.g., DRAM), non-volatile memory (e.g., RAM or ROM) in the form of flash memory, etc., a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid state drive (SSD), compact disk (CD), digital versatile disk (DVD), and so forth).

At least one of the communication chips 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to those described elsewhere herein. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

Hence, embodiments of trench-confined heteroepitaxial device stacks and their manufacture are described. In embodiments, a method of forming a heteroepitaxial device layer on a substrate, the method includes receiving a substrate with a semiconductor seeding surface; forming a hardmask fin over the seeding surface; forming an isolation region adjacent the hardmask fin; forming a trench with seeding surface at the bottom of the trench by removing the hardmask fin selectively relative to the isolation region; and epitaxially growing a semiconductor layer within the trench, the semiconductor layer having at least one of a lattice constant mismatch or CTE mismatch with the semiconductor seeding surface. In embodiments, forming the hardmask fin further comprises depositing a polycrystalline silicon or a silicon nitride layer over the seeding surface; and patterning the polycrystalline silicon or silicon nitride layer with an anisotropic etch. In embodiments, forming the hardmask fin further comprises depositing an etch stop layer directly on the seeding surface and depositing the polycrystalline silicon or a silicon nitride layer over the oxide layer. In embodiments, the anisotropic etch forms vertical sidewalls or slightly positively sloped sidewalls, and wherein the hardmask fin has an aspect ratio of at least 5:1. In embodiments, forming the isolation region further comprises: depositing an isolation dielectric layer over the hardmask fin, and planarizing the isolation dielectric layer to expose a top surface of the hardmask fin. In embodiments, forming the isolation region further comprises: etching a portion of the substrate adjacent to the hardmask fin to recess the substrate portion not protected by the hardmask fin relative to the seeding surface; and depositing the isolation dielectric layer over the recessed substrate surface. In embodiments, the method further includes planarizing a top surface of the epitaxial device layer with the isolation region; and recessing the isolation region relative to a top surface of the epitaxial device layer to form a non-planar semiconductor body comprising the epitaxial device layer with the isolation region adjacent to the non-planar semiconductor body. In embodiments, the method further includes forming a gate dielectric and a gate electrode over at least two opposite sides of the epitaxial device layer for control of carrier conduction between source and drain regions coupled to the device layer. In embodiments, the epitaxial device layer comprises Ge or a III-V binary, ternary, or quaternary semiconductor alloy, and forming the gate dielectric and the gate electrode further comprises etching a sacrificial semiconductor layer disposed between the seeding surface and the epitaxial device layer to expose a bottom surface of the epitaxial device layer; and backfilling the gate dielectric and gate electrode over the bottom surface In embodiments, a non-planar field effect transistor (FET) disposed over a silicon substrate, the non-planar FET includes a source region and a drain region with a non-silicon semiconductor channel disposed there between and over a planar semiconductor seeding surface having a composition other than that of the non-silicon semiconductor channel, the planar semiconductor seeding surface being a top surface of a semiconductor mesa surrounded by isolation dielectric; a gate dielectric layer and a gate electrode layer disposed over the non-silicon semiconductor channel. In embodiments, the non-silicon semiconductor channel is Ge, or a III-V binary ternary or quaternary compound semiconductor alloy, and wherein a center the channel is aligned with a center of the planar semiconductor seeding surface. In embodiments, a bottom surface of the isolation dielectric is in contact with a semiconductor surface recessed below the seeding surface. In embodiments, the seeding surface is recessed below a top surface of the dielectric isolation. In embodiments, the non-silicon semiconductor channel is one layer of a semiconductor stack having a top surface disposed a distance from the seeding surface at least three times a minimum lateral dimension of the seeding surface.

In embodiments, a CMOS device disposed over a silicon substrate, the CMOS device comprising: a pMOS device having: a first source region and a first drain region with a Ge semiconductor channel disposed there between and disposed over a first planar semiconductor seeding surface having a composition other than that of the channel, the first planar semiconductor seeding surface being a top surface of a first semiconductor mesa surrounded by isolation dielectric; and a first gate dielectric layer and a first gate electrode layer disposed over the Ge semiconductor channel; and an nMOS device having: a second source region and a second drain region with a III-V semiconductor channel disposed there between and disposed over a second planar semiconductor seeding surface having a composition other than that of the channel, the second planar semiconductor seeding surface being a top surface of a second semiconductor mesa surrounded by the isolation dielectric; and a second gate dielectric layer and a second gate electrode layer disposed over the III-V semiconductor channel. In embodiments, the Ge semiconductor channel has a top surface disposed a first distance from the seeding surface and the III-V semiconductor channel has a top surface disposed a second distance from the seeding surface, different the first distance. In embodiments, a center the Ge semiconductor channel is aligned with a center of the first planar semiconductor seeding surface, and wherein a center the III-V semiconductor channel is aligned with a center of the second planar semiconductor seeding surface. In embodiments, the first and second seeding surfaces are recessed below a top surface of the isolation dielectric. In embodiments, the first and second gate dielectrics wrap-completely around surfaces of the semiconductor channels extending between the sources and drains.

In embodiments, a mobile computing platform includes an integrated circuit comprising the non-planar FET as described herein or the CMOS device described herein and a display screen; and a wireless transceiver.

Accordingly, one or more embodiments of the present invention relate generally to trench-confined heteroepitaxial device stacks. It is to be understood that the above description is intended to be illustrative, and not restrictive. For example, while flow diagrams in the figures show a particular order of operations performed by certain embodiments of the invention, it should be understood that such order is not required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A non-planar field effect transistor (FET) disposed over a silicon substrate, the non-planar FET comprising:
   a source region and a drain region with a non-silicon semiconductor channel disposed there between and over a planar semiconductor seeding surface having a composition other than that of the non-silicon semiconductor channel, the planar semiconductor seeding surface being a top surface of a semiconductor mesa on the silicon substrate and surrounded by isolation dielectric wherein the semiconductor mesa is a different semiconductor than the silicon substrate and wherein the non-silicon semiconductor channel is a III-V binary, ternary or quaternary compound semiconductor alloy;
   a gate dielectric layer and a gate electrode layer disposed over the non-silicon semiconductor channel.

2. The non-planar FET of claim 1, wherein a center the channel is aligned with a center of the planar semiconductor seeding surface.

3. The non-planar FET of claim 2, wherein a bottom surface of the isolation dielectric is in contact with a semiconductor surface recessed below the seeding surface.

4. The non-planar FET of claim 3, wherein the seeding surface is recessed below a top surface of the dielectric isolation.

5. The non-planar FET of claim 3, wherein the non-silicon semiconductor channel is one layer of a semiconductor stack having a top surface disposed a distance from the seeding surface at least three times a minimum lateral dimension of the seeding surface.

* * * * *